(12) United States Patent
Kim

(10) Patent No.: US 8,946,728 B2
(45) Date of Patent: Feb. 3, 2015

(54) SEMICONDUCTOR LIGHT EMITTING DEVICE

(75) Inventor: Kyu Sang Kim, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 184 days.

(21) Appl. No.: 13/173,392

(22) Filed: Jun. 30, 2011

(65) Prior Publication Data

US 2012/0104439 A1 May 3, 2012

(30) Foreign Application Priority Data

Nov. 1, 2010 (KR) .......................... 10-2010-0107742

(51) Int. Cl.
 *H01L 33/58* (2010.01)
 *H01L 33/50* (2010.01)
 *H01L 33/08* (2010.01)
 *H01L 33/20* (2010.01)

(52) U.S. Cl.
 CPC .............. *H01L 33/501* (2013.01); *H01L 33/08* (2013.01); *H01L 33/20* (2013.01); *H01L 33/505* (2013.01); *H01L 2933/0091* (2013.01)
 USPC ... 257/79; 257/95; 257/E21.352; 257/E33.067; 257/E33.074; 257/E31.13

(58) Field of Classification Search
 None
 See application file for complete search history.

(56) References Cited

U.S. PATENT DOCUMENTS

| | | |
|---|---|---|
| 2002/0084745 A1 | 7/2002 | Wang et al. |
| 2004/0178417 A1 | 9/2004 | Andrews |
| 2007/0221867 A1* | 9/2007 | Beeson et al. ............. 250/487.1 |
| 2008/0042153 A1* | 2/2008 | Beeson et al. .................. 257/94 |
| 2008/0121917 A1* | 5/2008 | Weisbuch et al. ............... 257/98 |
| 2008/0157115 A1* | 7/2008 | Chuang et al. .................. 257/99 |
| 2008/0315228 A1* | 12/2008 | Krames et al. .................. 257/98 |
| 2009/0052159 A1 | 2/2009 | Abe et al. |
| 2010/0038665 A1* | 2/2010 | Sugiura et al. .................. 257/98 |

(Continued)

FOREIGN PATENT DOCUMENTS

| | | |
|---|---|---|
| CN | 101523625 A | 9/2009 |
| EP | 1394867 A2 | 3/2004 |

(Continued)

OTHER PUBLICATIONS

Taiwanese Office Action with English translation issued in Taiwanese Application No. 100121363 dated Aug. 23, 2013.

(Continued)

*Primary Examiner* — Fei Fei Yeung Lopez
(74) *Attorney, Agent, or Firm* — McDermott Will & Emery LLP

(57) ABSTRACT

A semiconductor light emitting device includes: a light emission structure including a first conductive semiconductor layer, an active layer, and a second conductive semiconductor layer; and a wavelength conversion layer formed on at least a portion of a light emission surface of the light emission structure, made of a light-transmissive material including phosphor particles, and having a void therein. A semiconductor light emitting device includes: a light emission structure including a first conductive semiconductor layer, an active layer, and a second conductive semiconductor layer; and a wavelength conversion layer formed on at least a portion of a light emission surface of the light emission structure, made of a light-transmissive material including phosphor particles or quantum dots, and having a void therein.

18 Claims, 6 Drawing Sheets

(56) References Cited

U.S. PATENT DOCUMENTS

| | | |
|---|---|---|
| 2010/0090245 A1 | 4/2010 | Lin et al. |
| 2011/0068676 A1 | 3/2011 | Jeon et al. |
| 2011/0108867 A1* | 5/2011 | Youn .............................. 257/98 |

FOREIGN PATENT DOCUMENTS

| | | |
|---|---|---|
| JP | 2002-064220 | 2/2002 |
| JP | 2010-087292 A | 4/2010 |
| KR | 10-2004-0021028 | 3/2004 |
| KR | 10-2008-0082080 | 9/2008 |
| KR | 10-2009-0002835 | 1/2009 |
| KR | 2009-0123817 A | 12/2009 |
| TW | 200536159 A | 11/2005 |
| TW | 200742760 A | 11/2007 |
| TW | 201015697 A | 4/2010 |
| TW | 201030273 A | 8/2010 |
| WO | WO 2008/044759 * | 4/2008 |
| WO | 2009-005311 A2 | 1/2009 |
| WO | 2010-134331 A1 | 11/2010 |

OTHER PUBLICATIONS

Chinese Office Action, with English translation thereof, issued in Chinese patent application No. 201110220323.8, dated Dec. 4, 2013.
Extended European Search Report issued in corresponding Eurpoean Application No. 11170630.5, dated Apr. 10, 2014.

* cited by examiner

SEMICONDUCTOR LIGHT EMITTING DEVICE

CROSS-REFERENCE TO RELATED APPLICATIONS

This application claims the priority of Korean Patent Application No. 10-2010-0107742 filed on Nov. 1, 2010, in the Korean Intellectual Property Office, the disclosure of which is incorporated herein by reference.

BACKGROUND OF THE INVENTION

1. Field of the Invention

The present invention relates to a semiconductor light emitting device.

2. Description of the Related Art

Recently, a light emitting device, such as a light emitting diode (LED) having a luminance which has been increasingly improved, has been employed as a light source of a display, a lighting system, or a vehicle, and white light having good efficiency can also be implemented therein by using phosphors (or a fluorescent material) or combining colors. In order to implement an LED having this purpose, a device must have a low operational voltage and a high luminance and luminous efficiency.

The luminous efficiency may be divided into internal luminous efficiency and external luminous efficiency. Internal luminous efficiency is related to a defect of a semiconductor material constituting a light emitting device, while external luminous efficiency, which denotes the efficiency of light emitted from the semiconductor material to an external environment, is related to total internal reflection resulting from the difference between a refractive index of the semiconductor material and that of a material constituting the environment surrounding the light emitting device.

The most general method, among methods for implementing a white LED, is performing wavelength conversion by using a yellow phosphor in a blue LED to combine blue light and yellow light to thus implement a white light source. This method is greatly affected by the efficiency of the phosphor layer in implementing white color.

The structure of the white LED using a general phosphor layer is manufactured in the form of a package, and an LED is die-bonded to a lead frame structure by using an adhesive resin, and an upper portion of the LED has a filler made of a composite resin such as silicon, epoxy, or the like, molded therearound. In this case, in order to implement white-colored light, phosphor powder is mixed with the molding filler, which is then molded in the LED-adhered lead frame package.

In a white LED package, a portion of blue light radiated from a blue LED is transmitted, while the remaining light collides with the phosphor included in the filler to excite the phosphor to radiate yellow light, and the blue light and yellow light are mixed to produce white light. This structure, however, is disadvantageous, in that a path difference is made for light to reach an external surface of the package, resulting in a failure to obtain uniform light, and also, non-uniformity of the phosphors included in the filler may degrade the color gamut.

SUMMARY OF THE INVENTION

An aspect of the present invention provides a semiconductor light emitting device.

According to an aspect of the present invention, there is provided a semiconductor light emitting device including: a light emission structure including a first conductive semiconductor layer, an active layer, and a second conductive semiconductor layer; and a wavelength conversion layer formed on at least a portion of a light emission surface of the light emission structure, made of a light-transmissive material including phosphor particles or quantum dots, and having a void therein.

The voids formed in the interior of the wavelength conversion layer may have at least one shape among a spherical shape, a cylindrical shape, and a polyhedral shape.

The plurality of voids formed in the interior of the wavelength conversion layer may be separately and regularly arranged to form certain patterns.

The patterns may include a plurality of voids having a rectangular parallelepiped shape and separately disposed in one direction and a plurality of voids having a rectangular shape and separately disposed in another direction, the voids forming lattice patterns.

The voids disposed in one direction and the voids disposed in another direction may be disposed on mutually different planes.

At least some of the voids may be exposed.

At least some of the voids may be filled with a material having a refractive index different from that of the wavelength conversion layer.

The voids may be filled with a material including at least one of $SiO_2$, $TiO_2$, and $Al_2O_3$.

A plurality of voids may be formed in the interior of the wavelength conversion layer and have irregular patterns.

The wavelength conversion layer may be formed on at least one of upper and side surfaces of the light emission structure.

According to an aspect of the present invention, there is provided a semiconductor light emitting device including: a substrate including a recess formed on one surface thereof; a light emission structure formed on the other surface of the substrate on which the recess is not formed, and including a first conductive semiconductor layer, an active layer, and a second conductive semiconductor layer; and a wavelength conversion layer formed in the recess of the substrate and made of a light-transmissive material including phosphor particles or quantum dots.

The wavelength conversion layer may include voids formed therein.

The voids formed in the interior of the wavelength conversion layer may have at least one shape among a spherical shape, a cylindrical shape, and a polyhedral shape.

At least some of the voids may be exposed.

At least some of the voids may be filled with a material having a refractive index different from that of the wavelength conversion layer.

The voids may be filled with a material including at least one of $SiO_2$, $TiO_2$, and $Al_2O_3$.

A plurality of voids may be formed in the interior of the wavelength conversion layer and have irregular patterns.

The recess formed on the substrate may have patterns having a three-dimensional shape.

The patterns having the three-dimensional shape may have a cylindrical shape or a polygonal pillar shape.

A plurality of recesses may be separately formed on the substrate.

The device may further include a concavo-convex structure formed in the interior of the recess.

The concave-convex structure formed in the interior of the recesses may have a cylindrical shape or a polygonal pillar shape.

The light emission structure may include: a first conductive semiconductor layer, an active layer, and a second conductive semiconductor layer which are sequentially stacked to be formed on the substrate, and further include: a first conductive electrode formed on the first conductive semiconductor layer exposed by etching portions of the second conductive semiconductor layer, the active layer, and the first conductive semiconductor layer; and a second conductive electrode formed on the second conductive semiconductor layer.

The substrate may be a sapphire substrate.

The wavelength conversion layer formed in the recess of the substrate may be coplanar with the substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
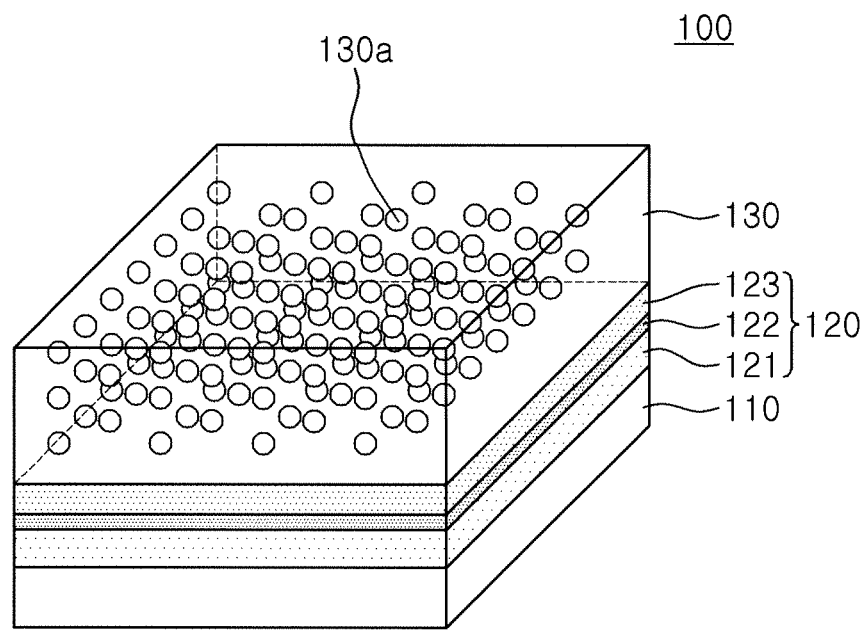
FIG. 1 is a schematic perspective view of a semiconductor light emitting device according to a first exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a schematic perspective view of a semiconductor light emitting device according to a first exemplary embodiment of the present invention. With reference to FIG. 1, a semiconductor light emitting device 100 according to the first exemplary embodiment of the present invention includes a light emission structure 120 formed on a substrate 110 and including a first conductive semiconductor layer 121, an active layer 122, and a second conductive semiconductor layer 123, and a wavelength conversion layer 130 formed on at least a portion of a light emission surface of the light emission structure 120, made of a light-transmissive material including phosphor particles, and including voids 130 therein. Unlike a case in which a wavelength conversion layer is formed to hermetically seal an LED chip along with a resin within a package, the wavelength conversion layer 130 formed with a uniform thickness on the upper surface of the light emission structure 120 to secure light uniformity. Also, because the wavelength conversion layer 130 includes the voids 130$a$ therein, an effective area of the wavelength conversion layer 130 can be increased, and because light emitted from the light emission structure 120 is refracted and diffused through the voids 130$a$ formed in the interior of the wavelength conversion layer 130, external light extraction efficiency can be improved.

The term "void" used in the present disclosure means a form of an empty space formed in the interior of a layer. The void may include a form completely enclosed against the exterior to prevent an empty space formed in the interior of a layer from being exposed to the outside thereof, or a form of an empty space formed in the interior of a layer and extending to be partially exposed to the outside thereof.

In the present exemplary embodiment, the first and second conductive semiconductor layers 121 and 123 may be n type or p type semiconductor layers and may be formed of nitride semiconductors. Thus, in the present exemplary embodiment, it may be understood that the first and second conductive semiconductor layers 121 and 123 refer to the n type and p type semiconductor layers, respectively, but the present invention is not limited thereto. The conductive semiconductor layers 121 and 123 may have an empirical formula of $Al_xIn_yGa_{(1-x-y)}N$ (Here, $0 \le x \le 1$, $0 \le y \le 1$, $0 \le x+y \le 1$), and for example, materials such as GaN, AlGaN, InGaN, or the like, may correspond thereto. The active layer 122 formed between the first and second conductive semiconductor layers 121 and 123 emits light having certain energy according to electron hole recombination and may have a multi-quantum well (MQW) structure in which a quantum well and a quantum barrier are alternately stacked. In this case, for example, a InGaN/GaN structure may be used as the MQW structure.

The substrate 110 formed on one surface of the light emission structure 120 may be a semiconductor growth substrate or a conductive substrate supporting the light emission structure 120 in a process, such as a laser lift-off process, or the like. In the present exemplary embodiment, the substrate 110 may be a semiconductor growth substrate on which the first conductive semiconductor layer 121, the active layer 122, and the second conductive semiconductor layer 123 are sequentially stacked. In this case, a growth substrate made of sapphire, SiC, $MgAl_2O_4$, MgO, $LiAlO_2$, $LiGaO_2$, GaN, or the like, may be used as the substrate 110. Sapphire is a crystal having Hexa-Rhombo R3c symmetry, of which lattice constants in c-axis and a-axis directions are 13.001□ and 4.758□, respectively. The sapphire crystal has a C (0001) face, an A (1120) face, an R (1102) face, and the like. In this case, a nitride thin film can be relatively easily grown on the C face of the sapphire crystal, and because sapphire crystal is stable at high temperatures, it is commonly used as a material of a nitride growth substrate. The wavelength conversion layer 130 formed on a portion of the light emission surface of the light emission structure 120 may include wavelength conversion phosphor particles for converting the wavelength of light emitted from the active layer 122 of the light emission structure 120. The phosphors may include a phosphor for converting the wavelength into one of yellow, red, and green, and the types of the phosphors may be determined by the wavelength emitted from the active layer 122 of the light emission structure 120. In detail, the wavelength conversion layer 130 may include one of YAG-based, TAG-based, silicate-based, sulfide-based, and nitride-based phosphors. For example, when a phosphor for converting the wavelength to yellow is applied to a blue emission LED chip, a white emission semiconductor light emitting device can be obtained.

Also, the wavelength conversion layer 130 may include quantum dots. A quantum dot is a nano crystal of a semiconductor material having a diameter ranging from 1 nm to 10 nm, exhibiting a quantum confinement effect. The quantum dots convert the wavelength of light emitted from the light emission structure to generate wavelength-converted light, namely, fluorescence. The quantum dot may be, for example, an Si-based nano crystal, a group II-IV compound semiconductor nano crystal, a group III-V compound semiconductor nano crystal, a group IV-VI compound semiconductor nano crystal, or the like, and in the present exemplary embodiment, these nano crystals may be used alone as the quantum dot or a mixture thereof may be used.

Referring to the quantum dot material, the group II-VI compound semiconductor nano crystal may be any one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnSTe. The group III-V compound semiconductor nano crystal may be any one selected from the group consisting of GaN, GaP, GaAs, AlN, Alp, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The group IV-VI-based compound semiconductor nano crystal may be, for example, SbTe.

The quantum dots may be distributed in the form of being naturally coordinated in a dispersive medium such as an organic solvent or a polymer resin. Any medium may be used as the dispersive medium of the wavelength conversion layer 130 so long as it is a transparent material which does not affect the wavelength conversion performance of the quantum dots, is not deteriorated by light or does not reflect light, and does not cause light absorption. For example, the organic solvent may include at least one among toluene, chloroform, and ethanol, and the polymer resin may include at least one among epoxy, silicon, polystyrene, and acrylate.

Meanwhile, the quantum dots emit light as excited electrons transition from a conduction band to a valence band, exhibiting the characteristics that even in the case of the same material, the wavelength of light varies according to the material particle size. As the size of the quantum dot is reduced, it emits light of a short wavelength, so light of a desired wavelength area can be obtained by adjusting the size of quantum dots. In the case of the present invention, the size of the quantum dots can be adjusted by appropriately changing the growth conditions of a nano crystal.

In the present exemplary embodiment, the wavelength conversion layer 130 can be formed on at least a portion of the light emission surface of the light emission structure 120. With reference to FIG. 1, the wavelength conversion layer 130 is formed only on the upper surface of the second conductive semiconductor layer 123, but the present invention is not limited thereto and the wavelength conversion layer 130 may be formed to cover the upper and side surfaces of the light emission structure 120, the light emission surface, or may be formed on a rear surface of the substrate 110 as necessary. The LED structure using the general wavelength conversion layer is manufactured as a package, and the LED mounted in the interior of the package is molded by using a material obtained by mixing a phosphor powder in a filler formed of a resin, such as silicon, epoxy, or the like. In this case, a portion of the light radiated from the LED passes through the resin, and the other remaining light collides with the phosphors included in the filler to excite the phosphors to radiate wavelength-converted light, and finally, the LED package emits light in which light radiated to the LED and the wavelength-converted light are mixed. However, this structure is disadvantageous in that a path difference is made for the light to reach an outer surface of the package, failing to implement uniform light. Also, the phosphors mixed in the filler are non-uniformly distributed to degrade color gamut.

However, in the present exemplary embodiment, because the wavelength conversion layer 130 is formed on the light emission surface of the light emission structure 120, a degradation of light uniformity otherwise caused due to the path difference from the light emitting device 100 to the exterior of the package can be avoided. Also, as shown in FIG. 1, because the wavelength conversion layer 130 includes the patterns in which the plurality of voids 130a are arranged, an effective area of the wavelength conversion layer 130 can be increased, and the plurality of voids 130a makes light, which reaches the wavelength conversion layer 130, after being emitted from the light emission structure 120, be diffused or refracted to thus reduce the rate of light absorbed to become extinct within the wavelength conversion layer 130, thus improving external light extraction efficiency. Also, because the wavelength conversion layer 130 including phosphors is formed only on the light emission surface of the chip, rather than including the phosphors within a filler applied in a package main body, the light emitting device can be suitably used for a case in which a narrow light origination angle is required, is advantageous for reducing the size of the package, and obtains the effect of reducing color blurs of the light source.

The wavelength conversion layer 130 having the voids 130a may be formed by using a method such as MOCVD (metal organic chemical vapor deposition) or ALD (atomic layer deposition) or by using an RF-sputterer, an e-beam evaporator, a thermal evaporator, or the like. Also, the wavelength conversion layer 130 may be formed through a thermal treatment process after patterning a photosensitive film by using a photolithography process, or a nano imprinting process, an e-beam process, or the like. Alternatively, filler particles and phosphor particles having a spherical form or a nano-sized shell-like form may be mixed in a light-transmissive material, and the mixture may be applied to the upper surface of the light emission structure and thermally treated to form the wavelength conversion layer 130, including the voids 130a illustrated in FIG. 1. Various etching processes may be applied according to the shape of the voids, and in this case, the etching processes may include wet etching using an etchant such as HF, HNO, or the like, or dry etching using an RIE (Reactive Ion Etching) method, ICP-RIE (Inductive Coupled Plasma RIE) method, or the like. The voids 130a formed in the interior of the wavelength conversion layer 130 may be formed to have periodical or non-periodical patterns.

Some of the voids 130a formed in the interior of the wavelength conversion layer 130 may be formed to be exposed. In detail, the voids 130a may be exposed to upper and side surfaces of the wavelength conversion layer 130 to form protrusion and depression patterns (concavo-convex patterns or uneven patterns). The interior of the voids 130a may be filled with a material, e.g., $SiO_2$, $TiO_2$ and $Al_2O_3$, having a refractive index different from that of the wavelength conversion layer 130 to improve external light extraction efficiency.

Figure 2:
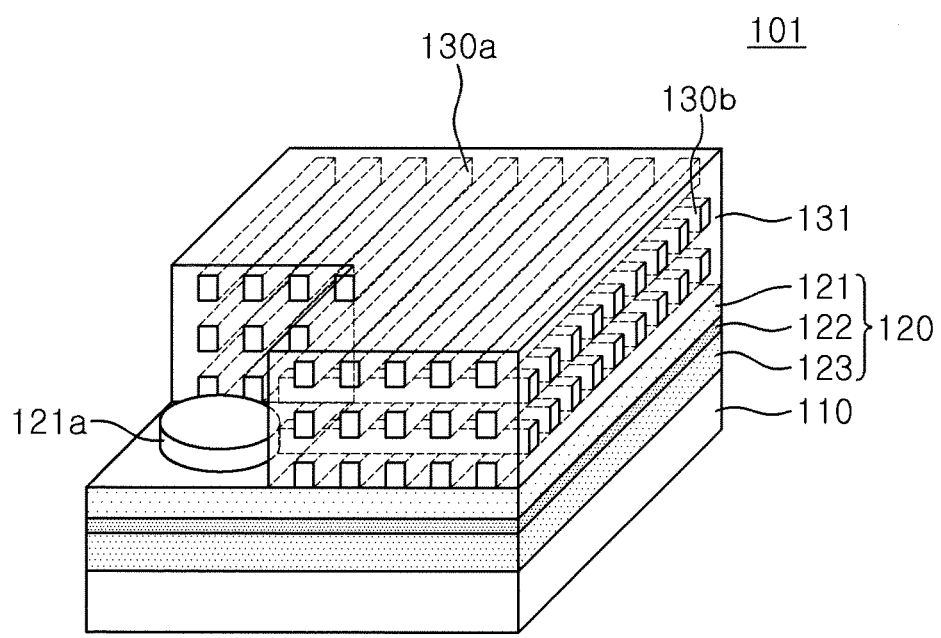
FIG. 2 is a schematic perspective view of a modification of the semiconductor light emitting device according to the first exemplary embodiment of the present invention.

FIG. 2 is a schematic perspective view of a modification of the semiconductor light emitting device according to the first exemplary embodiment of the present invention. Unlike the semiconductor light emitting device illustrated in FIG. 1, in the semiconductor light emitting device according to the present exemplary embodiment, voids 130a having a lattice form are formed in the interior of the wavelength conversion layer 131 formed on the light emission surface of the light emission structure 120. In the present exemplary embodiment, a plurality of voids 130a and 130b having a rectangular parallelepiped shape are separately formed in the interior of the wavelength conversion layer 131, and they are stacked in different directions to form the lattice patterns. The wavelength conversion layer 131 is stacked by using the foregoing MOCVD method, or the like, and then, a photosensitive film pattern may be formed on an upper surface of the wavelength conversion layer 131 and exposing and etching processes may be repeatedly performed to form the lattice patterns illustrated in FIG. 2. In this case, the voids 130a and 130b may be formed to be nano-sized in the wavelength conversion layer 131, to thereby serve to polarize light emitted from the active layer 120 of the light emission structure 120.

In the semiconductor light emitting device according to the present exemplary embodiment, unlike the semiconductor light emitting device illustrated in FIG. 1, the substrate 110 may be a conductive substrate. In detail, the light emission structure 120 including the first conductive semiconductor layer 121, the active layer 122, and the second conductive semiconductor layer 123, which are sequentially stacked on a growth substrate (not shown), may be formed on the substrate 110, and the substrate 110 may serve as a support supporting the light emission structure 120 in a process, such as a laser lift-off process, or the like. The conductive substrate 110 may be made of a material including one or more of Au, Ni, Al, Cu, W, Si, Se, and GaAs, e.g., a material obtained by doping aluminum (Al) in silicon (Si). In this case, the conductive substrate 110 may be formed according to method such as plating, bonding, or the like. In the present exemplary embodiment, the conductive substrate 110 is electrically connected to the second conductive semiconductor layer 123, and accordingly, an electrical signal may be applied to the second conductive semiconductor layer 123 through the conductive substrate 110. Also, as shown in FIG. 2, a first conductive electrode 121a for applying an electrical signal to the first conductive semiconductor layer 121 may be formed on a portion of the first conductive semiconductor layer 121 exposed by removing a portion of the wavelength conversion layer 131.

Figure 3:
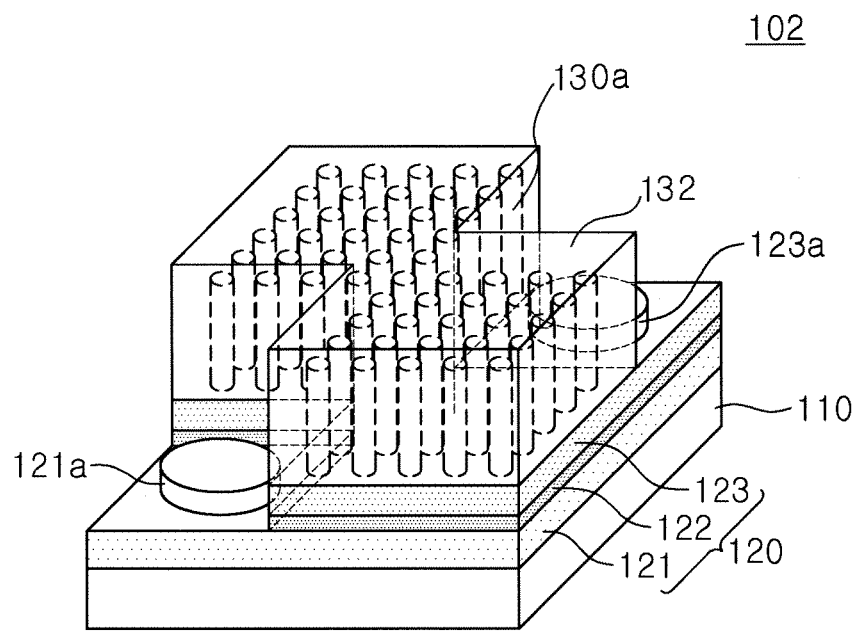
FIG. 3 is a schematic perspective view of another modification of the semiconductor light emitting device according to the first exemplary embodiment of the present invention.

FIG. 3 is a schematic perspective view of another modification of the semiconductor light emitting device according to the first exemplary embodiment of the present invention. With reference to FIG. 3, a semiconductor light emitting device 102 according to the present exemplary embodiment may include a light emission structure including the first conductive semiconductor layer 121, the active layer 122, and the second conductive semiconductor layer 123, and a wavelength conversion layer 132 formed on at least a portion of a light emission surface of the light emission structure 120 and having voids 130a therein. The voids 130a formed in the interior of the wavelength conversion layer 132 may have a cylindrical shape, and in this case, because a plurality of voids 130a are separately formed in the interior of the wavelength conversion layer 132, external light extraction efficiency can be improved. In the present exemplary embodiment, the cylindrical plurality of voids 130a are formed to have periodical patterns at certain intervals, but the shape of the voids 130a is not limited thereto and the plurality of voids 130a may be formed to have various other shapes including a polygonal pillar shape and have periodical or non-periodical patterns.

In the present exemplary embodiment, a second conductive electrode 123a for applying an electrical signal to the second conductive semiconductor layer 123 may be formed on an upper surface of the second semiconductor layer 123 exposed by etching a portion of the second wavelength conversion layer 123, and a first conductive electrode 121a may be formed on the upper surface of the first conductive semiconductor layer 121 exposed by etching portions of the wavelength conversion layer 130, the second conductive semiconductor layer 123, the active layer 122, and the first conductive semiconductor layer 121. In the present exemplary embodiment, an electrical signal may be applied to the light emission structure 120 through the first and second conductive electrodes 121a and 123a. An insulating growth substrate, e.g., a sapphire substrate, may be used as the substrate 110, but the present invention is not limited thereto.

Figure 4:
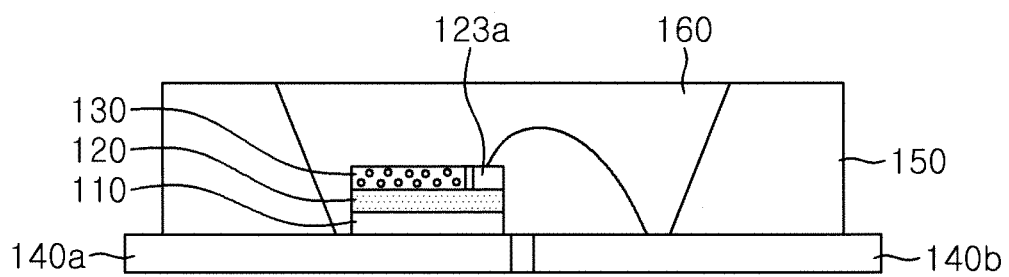
FIG. 4 is a schematic sectional view showing a semiconductor light emitting device mounted in a package according to an exemplary embodiment of the present invention.

FIG. 4 is a schematic sectional view showing a semiconductor light emitting device mounted in a package according to an exemplary embodiment of the present invention. With reference to FIG. 4, the semiconductor light emitting device 100 including the substrate 110, the light emission structure formed on the substrate 110, and the wavelength conversion layer 130 formed on the light emission surface of the light emission structure 120 and including the patterns having the voids therein may be mounted in the interior of a package main body 150 having a recess. Although not shown in detail, the light emission structure 120 may include a first conductive semiconductor layer, an active layer, and a second conductive semiconductor layer which are sequentially stacked, and the second conductive electrode 123a for applying an electrical signal to the second conductive semiconductor layer may be formed on the upper surface of the second conductive semiconductor layer. In this case, the substrate 110 may be a conductive substrate and may be used as a first conductive electrode for applying an electrical signal to the first conductive semiconductor layer 121 of the light emission structure 120. The conductive substrate 110 and the second conductive electrode 123a may be electrically connected to first and second lead frames 140a and 140b to thus receive an electrical signal from the exterior.

In the present exemplary embodiment, the conductive substrate 110 connected to the first conductive semiconductor layer is in contact with the first lead frame 140a so as to be directly connected thereto, and the second conductive electrode 123a formed on the second conductive semiconductor layer may be electrically connected to the second lead frame 140b through a conductive wire. As shown in FIG. 4, the package main body 150 may include a reflection structure for upwardly inducing light which is emitted from the active layer of the light emission structure, and the recess formed in the package main body 150 may include a light-transmissive resin 160 for protecting the semiconductor light emitting device against the exterior.

Figure 5:
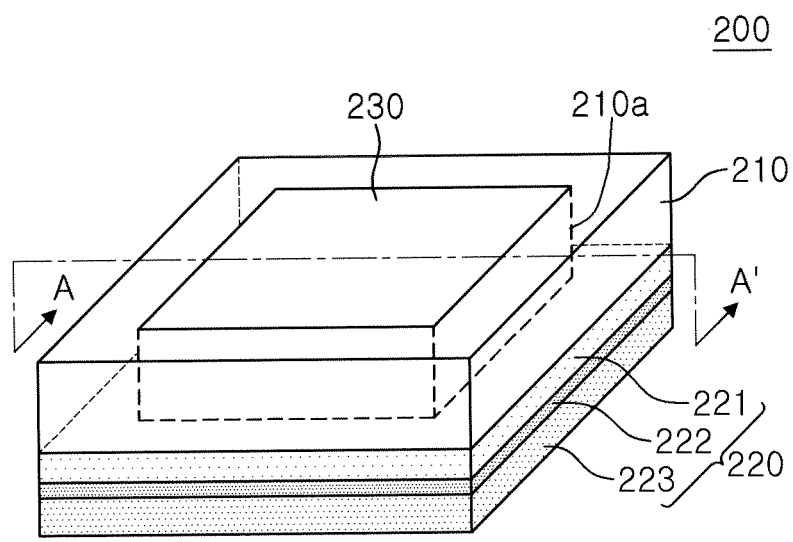
FIG. 5 is a schematic perspective view of a semiconductor light emitting device according to a second exemplary embodiment of the present invention.
Figure 6:
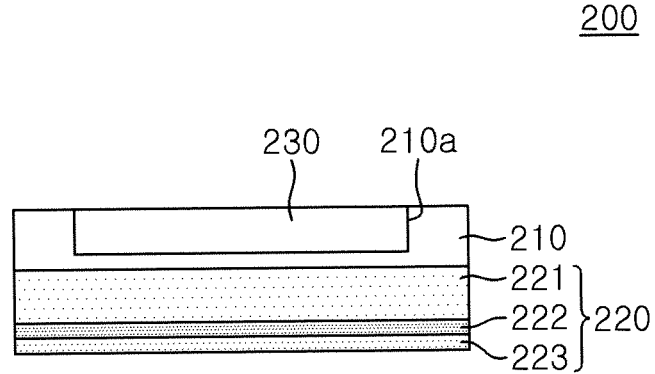
FIG. 6 is a schematic sectional view of the semiconductor light emitting device of FIG. 5 taken along line A-A'.

FIG. 5 is a schematic perspective view of a semiconductor light emitting device according to a second exemplary embodiment of the present invention. FIG. 6 is a schematic sectional view of the semiconductor light emitting device of FIG. 5 taken along line A-A'. With reference to FIGS. 5 and 6, a semiconductor light emitting device 200 according to the present exemplary embodiment includes a substrate 210 having a recess 210*a* formed on one surface of the substrate 210, a light emission structure 220 formed on the other surface of the substrate 210 and including a first conductive semiconductor layer 221, an active layer 222, and a second conductive semiconductor layer 223, and a wavelength conversion layer 230 formed in the interior of the recess 210*a* formed on the substrate 210. The wavelength conversion layer 230 is made of a light-transmissive material, so the thickness and position of the wavelength conversion layer 230 can be easily adjusted, and accordingly, light uniformity can be improved, color blurs can be reduced, and in addition, because the wavelength conversion layer 230 is formed in the interior of the recess 210*a* formed on the substrate 210, the size of the semiconductor light emitting device 200 can be reduced. Namely, as shown in FIG. 5, the wavelength conversion layer 230 may be formed to have a thickness equal to the depth of the recess 210*a*, and accordingly, the wavelength conversion layer 230 is coplanar with a formation surface of the recess 210*a* of the substrate 210.

In the present exemplary embodiment, as described above, the first and second conductive semiconductor layers 221 and 223 may be n type or p type semiconductor layers and may be made of a nitride semiconductor material. The active layer 222 formed between the first and second conductive semiconductor layers 221 and 223 may emit light having a certain energy according to electron hole recombination and may have a multi-quantum well (MQW) structure in which a quantum well and a quantum barrier are alternately stacked.

The substrate 210 formed on one surface of the light emission structure 220 may be a semiconductor growth substrate or a conductive substrate supporting the light emission structure 220 in a process such as a laser lift-off process, or the like. In the present exemplary embodiment, the substrate 210 may be a semiconductor growth substrate for sequentially stacking the first conductive semiconductor layer 221, the active layer 222, and the second conductive semiconductor layer 223, but the present invention is not limited thereto. In this case, a growth substrate made of a material such as sapphire, SiC, $MgAl_2O_4$, MgO, $LiAlO_2$, $LiGaO_2$, GaN, or the like.

The wavelength conversion layer 230 formed in the interior of the recess 210*a* formed on the substrate 210 may include wavelength conversion phosphor particles or quantum dots for converting the wavelength of light emitted from the active layer 222 of the light emission structure 220. As mentioned above, the phosphors may include a phosphor or a quantum dot for converting the wavelength into one of yellow, red, and green, and the types of the phosphors and quantum dots may be determined by the wavelength emitted from the active layer 222 of the light emission structure 220.

The recess 210*a* formed on the substrate 210 may be formed through a process of applying a photosensitive film on the upper surface of the substrate 210, masking the position where the recess is to be formed, performing an exposing and developing operation, etching a portion of the substrate 210, and removing the photosensitive film. In detail, the photosensitive film has qualities that a photosensitive part is not dissolved (negative type) or dissolved (positive type) in a developer through a light irradiation thereto. The component (generally, an organic polymer) of them is dissolved in an organic solvent. Light may be irradiated to the photosensitive film to form a pattern, and the recess may be formed at an area corresponding to the pattern. The etching process may be performed through a dry etching process using an etching gas such as a fluorine-based etching gas such as $CF_4$, $SF_6$, or the like, a chlorine-based etching gas such as $Cl_2$, $BCl_3$, or the like, or an etching gas such as argon (Ar) or the like. Alternately, the recess 210*a* may also be formed in the interior of the substrate 210 through wet etching using a solution such as KOH, or the like.

In the present exemplary embodiment, because the wavelength conversion layer 230 is not directly formed on the upper surface of the light emission structure 220 but is formed in the interior of the recess 210*a* formed on the substrate 210, the thickness and position of the wavelength conversion layer 230 can be easily adjusted, and accordingly, uniform light with a reduced amount of color blurs can be obtained. Also, because the wavelength conversion layer 230 is formed in the interior of the substrate 210, a package main body for applying a resin including phosphor particles is not required, reducing the size of the package.

Figure 7:
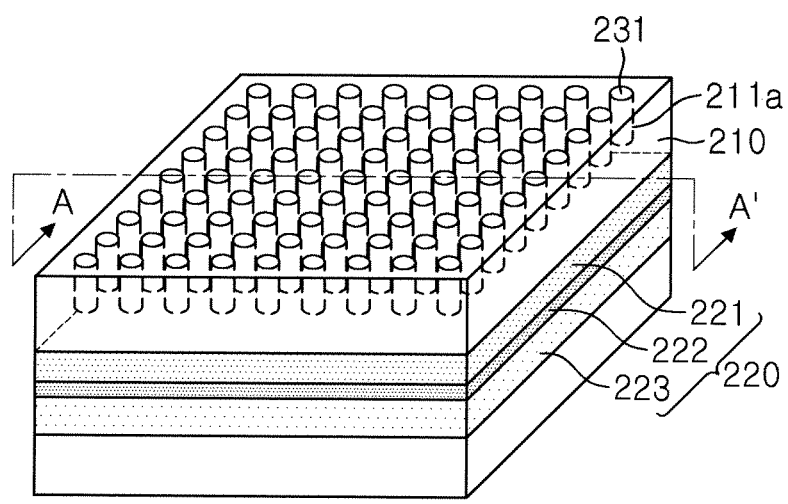
FIG. 7 is a schematic perspective view of a modification of a semiconductor light emitting device according to a second exemplary embodiment of the present invention.
Figure 8:
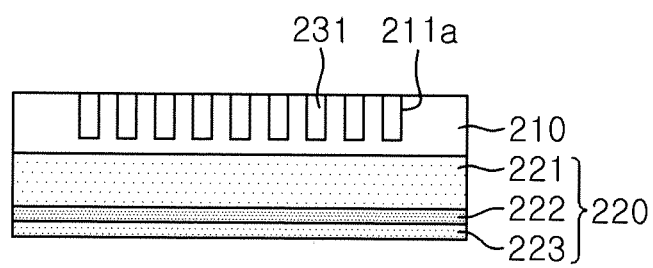
FIG. 8 is a schematic sectional view of the semiconductor light emitting device of FIG. 7 taken along line A-A'.

FIG. 7 is a schematic perspective view of a modification of a semiconductor light emitting device 201 according to a second exemplary embodiment of the present invention. FIG. 8 is a schematic sectional view of the semiconductor light emitting device 201 of FIG. 7 taken along line A-A'. With reference to FIGS. 7 and 8, the semiconductor light emitting device 201 according to the second exemplary embodiment of the present invention include the substrate 210 having recesses 210*a* formed on one surface thereof, the light emission structure 220 formed on the other surface of the substrate 210 on which the recesses 211*a* are not formed and including the first conductive semiconductor layer 221, the active layer 222, and the second conductive semiconductor layer 223, and a wavelength conversion layer 231 formed on the recesses 211*a* of the substrate 210 and made of a light-transmissive material including phosphor particles.

Figure 9:
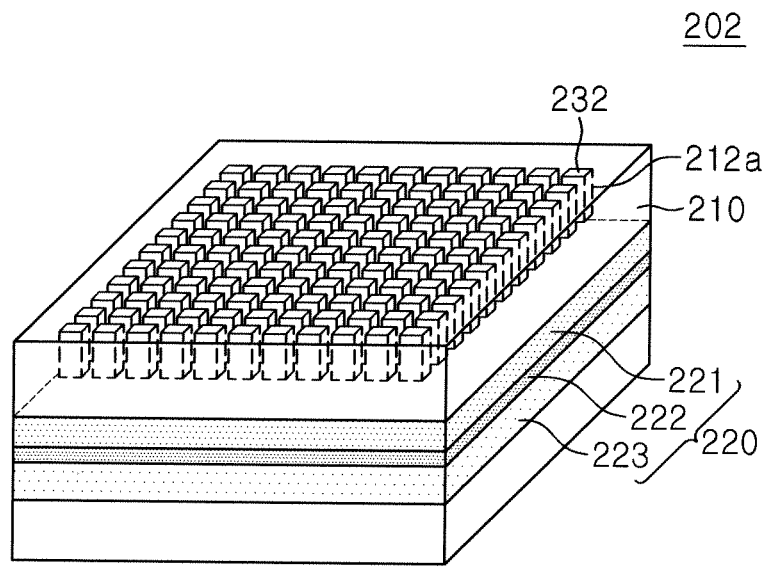
FIG. 9 is a schematic perspective view of another modification of a semiconductor light emitting device according to the second exemplary embodiment of the present invention.

In the semiconductor light emitting device 201 according to the present exemplary embodiment, unlike the semiconductor light emitting device 200 illustrated in FIG. 5, the plurality of recesses 211*a* are separately formed on the substrate 210 and the wavelength conversion layer 231 may be formed in the interior of each of the recesses 211*a*. The difference between a refractive index of the substrate 210 and that of the wavelength conversion layer 231 formed in the interior of the recesses 211*a* of the substrate 210 can lead to the obtaining of a similar effect to that of a case in which protrusions and depressions are formed on the substrate 210. Accordingly, light extraction efficiency on the interface between the recesses 211*a* and the wavelength conversion layer 231 can be improved. Also, because the wavelength conversion layer 231 is formed in the interior of the substrate 210, the size of the semiconductor light emitting device 201 can be reduced. In FIG. 7, the recesses 211*a* formed on the substrate 210 are illustrated to have a cylindrical shape having periodical patterns, but as shown in FIG. 9, the recesses 212*a* may have a rectangular pillar shape, and the size, shape, depth, and the like of the recesses 212*a* may be variably modified as necessary.

Figure 10:
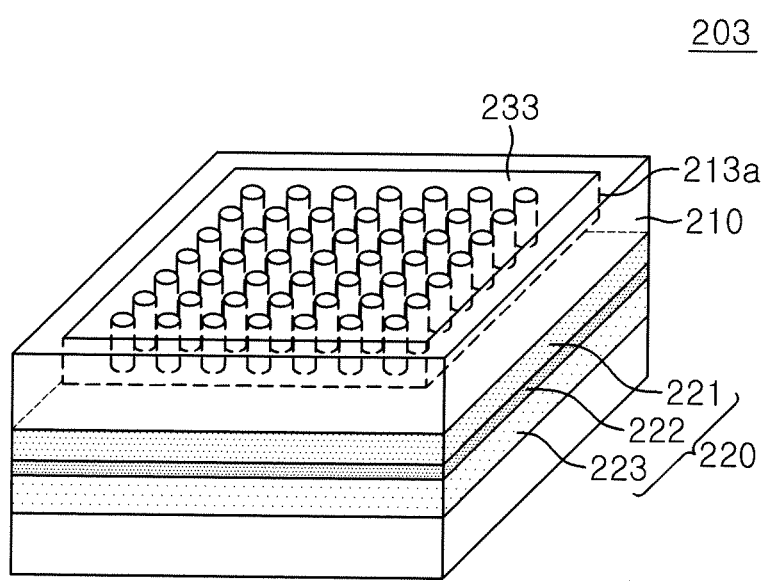
FIG. 10 is a schematic perspective view of another modification of a semiconductor light emitting device according to the second exemplary embodiment of the present invention.

FIG. 10 is a schematic perspective view of another modification of a semiconductor light emitting device 203 according to the second exemplary embodiment of the present invention. With reference to FIG. 10, unlike the semiconductor light emitting device 201, the semiconductor light emitting device 203 may further include three-dimensional patterns formed in the interior of a recess 213a having a square shape on the substrate 210. The three-dimensional patterns may be formed by forming the patterns in an area in which the recesses 213a are to be formed and not removing a portion of the substrate 210, in the process of forming the recesses 213a on one surface of the substrate 210. In detail, in order to form the patterns having the cylindrical shape as shown in FIG. 10, a photosensitive pattern having a circular shape may be formed in the interior of the recess 213a and areas, excluding the areas in which the patterns are formed, are etched to thus form the recess 213a having the three-dimensional patterns therein. In this case, the structure is similar to a structure in which protrusions and depressions are formed in the recess 213a of the substrate 210. When the interior of the recess 213a is filled with a wavelength conversion layer 233 including phosphors, light emitted from the active layer 222 of the light emission structure 220 can be wavelength-converted in the wavelength conversion layer 233 formed in the interior of the recess 213a formed on the substrate 210 and, at the same time, diffused and refracted from the surface having the protrusions and depressions formed on the substrate 210, thus increasing external light extraction efficiency.

Figure 11:
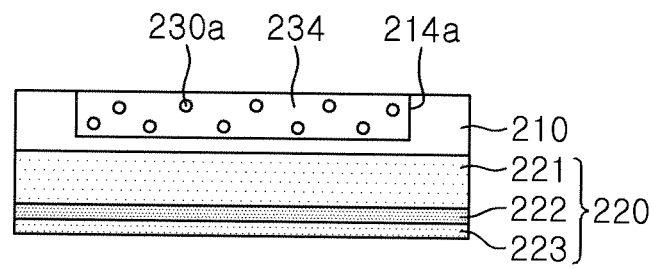
FIG. 11 is a schematic sectional view of another modification of a semiconductor light emitting device according to the second exemplary embodiment of the present invention.

FIG. 11 is a schematic perspective view of another modification of a semiconductor light emitting device according to the second exemplary embodiment of the present invention. With reference to FIG. 11, a semiconductor light emitting device according to the present exemplary embodiment includes the substrate including a recess 214a formed on one surface thereof, a light emission structure 220 formed on the other surface of the substrate 210 on which the recess 214a is not formed, and including the first conductive semiconductor layer 221, the active layer 222, and the second conductive semiconductor layer 223, and a wavelength conversion layer 234 formed on the recess 214a of the substrate 210. The wavelength conversion layer 234 may include a pattern having voids 230a therein, whereby an effective area of the wavelength conversion layer 234 can be increased, light, which has reached the wavelength conversion layer 234 after being emitted from the light emission structure 230, can be diffused and refracted. Thus, the amount of light which is absorbed to become extinct in the interior of the wavelength conversion layer 234 can be reduced to thus improve external light extraction efficiency.

Some of the voids 230a formed in the interior of the wavelength conversion layer 234 may be exposed. In detail, the voids 230a may be exposed from upper and side surfaces of the wavelength conversion layer 234 to form a pattern of protrusions and depressions. Also, the interior of the voids 230a is filled with a material having a refractive index different from that of the wavelength conversion layer 234, e.g., a material including at least one of $SiO_2$, $TiO_2$ and $Al_2O_3$, to improve external light extraction efficiency.

Figure 12:
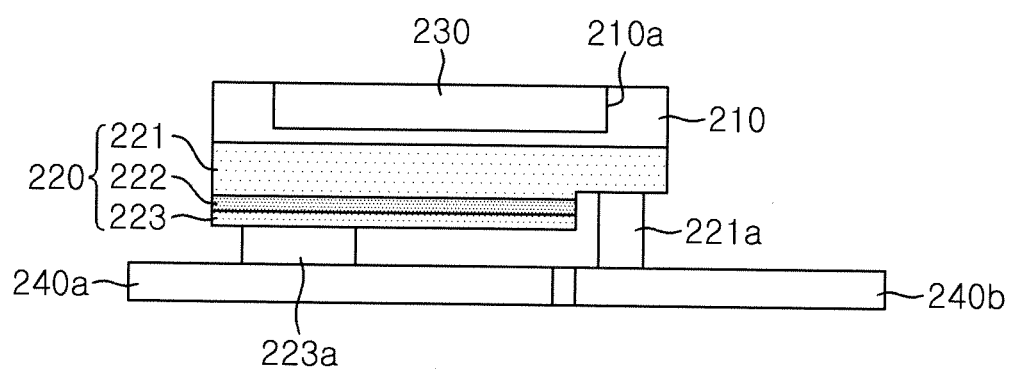
FIG. 12 is a schematic sectional view showing a semiconductor light emitting device mounted on a lead frame according to an exemplary embodiment of the present invention.

FIG. 12 is a schematic sectional view showing a semiconductor light emitting device mounted on a lead frame according to an exemplary embodiment of the present invention. With reference to FIG. 12, the semiconductor light emitting device according to the present exemplary embodiment includes the substrate 210 including a recess 210a formed on one surface of the substrate 210, a light emission structure 220 formed on the other surface of the substrate 210 and including the first conductive semiconductor layer 221, the active layer 222, and the second conductive semiconductor layer 223, and the wavelength conversion layer 230 formed in the interior of the recess 210a formed on the substrate 210. A second conductive electrode 223a for applying an electrical signal to the second conductive semiconductor layer 223 may be formed on the second conductive semiconductor layer 223, and a first conductive electrode 221a may be formed on the first conductive semiconductor layer 221 exposed by etching portions of the second conductive semiconductor layer 223, the active layer 222, and the first conductive semiconductor layer 221. The first and second conductive electrodes 221a and 223a may be connected to a pair of lead frames 240a and 240b which are electrically separated, to receive an electrical signal from the exterior.

According to the present exemplary embodiment, a portion of light emitted from the active layer 222 of the light emission structure 220 is wavelength-converted by the wavelength conversion layer 230 formed on the recess 210a of the substrate 210 and made of a light-transmissive material including phosphor particles, so as to be emitted, and a portion of light emitted toward the lead frames 240a and 240b from the active layer 222 is reflected by the lead frames 240a and 240b so as to be upwardly induced. The mounting configuration of the semiconductor light emitting device according to the present exemplary embodiment is not limited to the configuration illustrated in FIG. 12, and, of course, the semiconductor light emitting device may be mounted in various forms as necessary.

As set forth above, according to exemplary embodiments of the invention, external light extraction efficiency of light emitted from a light emission structure can be improved.

In addition, the semiconductor light emitting device can be suitable for a case in which a narrow light origination angle is required, has reduced color blurs, and is advantageous for reducing the size of a package.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
   a light emission structure comprising a first conductive semiconductor layer, an active layer, and a second conductive semiconductor layer; and
   a wavelength conversion layer disposed on at least a portion of a light emission surface of the light emission structure, made of a light-transmissive material including phosphor particles or quantum dots, and having a plurality of voids therein,
   wherein the plurality of voids are disposed in the interior of the wavelength conversion layer and are separately and regularly arranged to form certain patterns, and
   wherein the patterns comprise a plurality of voids having a rectangular parallelepiped shape and separately disposed in one direction and a plurality of voids having a rectangular shape and separately disposed in another direction, the voids forming lattice patterns.

2. The device of claim 1, wherein the voids disposed in one direction and the voids disposed in another direction are disposed on mutually different planes.

3. A semiconductor light emitting device comprising:
   a substrate including a recess disposed on one surface thereof;
   a light emission structure disposed on an other surface of the substrate on which the recess is not disposed, and including a first conductive semiconductor layer, an active layer, and a second conductive semiconductor layer; and
   a wavelength conversion layer disposed in the recess of the substrate, made of a light-transmissive material including phosphor particles or quantum dots, and having voids disposed in an interior of the wavelength conversion layer so as to be completely enclosed by the wavelength conversion layer, wherein the plurality of voids are disposed in the interior of the wavelength conversion layer and are separately and regularly arranged to form certain patterns, and the patterns comprise a plurality of voids having a rectangular parallelepiped shape and separately disposed in one direction and a plurality of voids having a rectangular shape and separately disposed in another direction, the voids forming lattice patterns.

4. The device of claim 3, wherein the voids disposed in the interior of the wavelength conversion layer have at least one shape among a spherical shape, a cylindrical shape, and a polyhedral shape.

5. The device of claim 3, wherein the wavelength conversion layer further comprises at least some voids that are exposed to an outside of the wavelength conversion layer.

6. The device of claim 3, wherein the wavelength conversion layer further comprises cavities filled with a material having a refractive index different from that of the wavelength conversion layer.

7. The device of claim 6, wherein the cavities are filled with a material including at least one of $SiO_2$, $TiO_2$, and $Al_2O_3$.

8. The device of claim 3, wherein a plurality of voids are disposed in the interior of the wavelength conversion layer and have irregular patterns.

9. The device of claim 3, wherein the recess disposed on the substrate has patterns having a three-dimensional shape.

10. The device of claim 9, wherein the patterns having the three-dimensional shape have a cylindrical shape or a polygonal pillar shape.

11. The device of claim 3, wherein a plurality of recesses are separately disposed on the substrate.

12. The device of claim 3, further comprising:
a concavo-convex structure disposed in the interior of the recess.

13. The device of claim 12, wherein the concave-convex structure disposed in the interior of the recess has a cylindrical shape or a polygonal pillar shape.

14. The device of claim 3, wherein the light emission structure comprises the first conductive semiconductor layer, the active layer, and the second conductive semiconductor layer which are sequentially stacked to be disposed on the substrate, and the light emission structure further comprises:

a first conductive electrode disposed on the first conductive semiconductor layer exposed by etching portions of the second conductive semiconductor layer, the active layer, and the first conductive semiconductor layer; and a second conductive electrode disposed on the second conductive semiconductor layer.

15. The device of claim 3, wherein the substrate is a sapphire substrate.

16. The device of claim 3, wherein the wavelength conversion layer disposed in the recess of the substrate is coplanar with the substrate.

17. The device of claim 3, wherein the voids disposed in one direction and the voids disposed in another direction are disposed on mutually different planes.

18. The device of claim 3, wherein the voids are disposed so as to be completely enclosed against the exterior to prevent empty spaces formed in the interior of the voids from being exposed to the outside of the wavelength conversion layer.

* * * * *